(12) United States Patent
Uemura et al.

(10) Patent No.: US 8,853,012 B2
(45) Date of Patent: Oct. 7, 2014

(54) DISPLAY DEVICE AND METHOD FOR MANUFACTURING THE SAME

(71) Applicant: Japan Display Inc., Tokyo (JP)

(72) Inventors: Norihiro Uemura, Mobara (JP);
Takeshi Noda, Mobara (JP); Hidekazu Miyake, Mobara (JP); Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 13/965,418

(22) Filed: Aug. 13, 2013

(65) Prior Publication Data

US 2014/0054583 A1 Feb. 27, 2014

(30) Foreign Application Priority Data

Aug. 23, 2012 (JP) ................. 2012-184107

(51) Int. Cl.
*H01L 21/00* (2006.01)
*H01L 21/84* (2006.01)
*H01L 33/00* (2010.01)
*H01L 21/77* (2006.01)

(52) U.S. Cl.
CPC ............ *H01L 33/0041* (2013.01); *H01L 21/77* (2013.01)
USPC ........ 438/149; 257/E29.273; 438/30; 438/158

(58) Field of Classification Search
USPC .................. 438/30, 149, 158; 257/E29.273
See application file for complete search history.

(56) References Cited

U.S. PATENT DOCUMENTS

2011/0193076 A1* 8/2011 Yun et al. .................. 257/43
2012/0043548 A1* 2/2012 Arai et al. .................. 257/59

FOREIGN PATENT DOCUMENTS

| JP | 2010-278077 | 12/2010 |
| JP | 2011-166135 | 8/2011 |
| JP | 2012178452 A * | 9/2012 |

* cited by examiner

*Primary Examiner* — Daniel Whalen
(74) *Attorney, Agent, or Firm* — Antonelli, Terry, Stout & Kraus, LLP.

(57) ABSTRACT

A gate insulating film has a convex portion conforming to a surface shape of a gate electrode and a step portion that changes in height from a periphery of the gate electrode along the surface of the gate electrode. An oxide semiconductor layer is disposed on the gate insulating film so as to have a transistor constituting region having a channel region, a source region, and a drain region in a continuous and integral manner and a covering region being separated from the transistor constituting region and covering the step portion of the gate insulating film. A channel protective layer is disposed on the channel region of the oxide semiconductor layer. A source electrode and a drain electrode are disposed in contact respectively with the source region and the drain region of the oxide semiconductor layer. A passivation layer is disposed on the source electrode and the drain electrode.

10 Claims, 6 Drawing Sheets

DISPLAY DEVICE AND METHOD FOR MANUFACTURING THE SAME

CROSS-REFERENCE TO RELATED APPLICATION

The present application claims priority from Japanese application JP2012-184107 filed on Aug. 23, 2011, the content of which is hereby incorporated by reference into this application.

BACKGROUND OF THE INVENTION

1. Field of the Invention

The present invention relates to a display device and a method for manufacturing the same.

2. Description of the Related Art

In flat panel displays, a thin film transistor (TFT) is used as a switching element. In a bottom-gate TFT, a gate electrode is disposed on a substrate, and a gate insulating film is formed on the substrate so as to cover the gate electrode. A convex portion is formed on the substrate due to the presence of the gate electrode, and the gate insulating film has a surface shape conforming to the surface shape of the convex portion as a base because of the characteristic of the deposition process. That is, the gate insulating film has a portion (step) that changes in height from the periphery of the gate electrode along the surface of the gate electrode. In other words, the gate insulating film has the step above the edge of the gate electrode.

JP 2010-278077 A discloses a structure in which a channel protective layer is provided and a semiconductor layer composed of amorphous silicon or polysilicon is arranged inside the periphery of a gate electrode. In this structure, since the semiconductor layer is located inside the periphery of the gate electrode, the semiconductor layer is not present on a step of a gate insulating film.

JP 2011-166135 A discloses a structure in which a channel protective layer is provided and an oxide semiconductor layer is extended to the outside of a gate electrode. In this structure, since the semiconductor layer is located outside the gate electrode, the semiconductor layer is present on a step of a gate insulating film.

When it is intended to realize the structure disclosed in JP 2010-278077 A with an oxide semiconductor, the gate insulating film is also reduced in thickness during processing of the channel protective layer. The thinning of the gate insulating film causes a problem of a reduction in dielectric withstand voltage.

In the structure disclosed in JP 2011-166135 A, the semiconductor layer is also formed at a portion where a reduction in dielectric withstand voltage is particularly problematic, that is, above the step portion of the gate insulating film generated by the thickness of the gate electrode. Therefore, since the semiconductor layer serves as a protective layer during processing of the channel protective layer, a reduction in dielectric withstand voltage due to a reduction in thickness of the gate insulating film is not caused.

In a bottom-gate TFT, however, when a semiconductor layer is formed wider than a gate electrode, there arises a problem in that the light of a backlight is incident on the semiconductor layer to accelerate the deterioration of the semiconductor layer (channel) and thereby reduce the reliability.

SUMMARY OF THE INVENTION

It is an object of the invention to prevent a reduction in reliability due to the entrance of light and a reduction in dielectric withstand voltage.

(1) A display device according to an aspect of the invention includes: a substrate; a gate electrode disposed on the substrate; a gate insulating film disposed on the substrate so as to cover the gate electrode and having a convex portion conforming to a surface shape of the gate electrode and a step portion that changes in height along a shape rising from a periphery of the gate electrode; an oxide semiconductor layer disposed on the gate insulating film so as to have a transistor constituting region having a channel region, a source region, and a drain region in a continuous and integral manner and a covering region being separated from the transistor constituting region and covering the step portion of the gate insulating film; a channel protective layer disposed on the channel region of the oxide semiconductor layer; a source electrode and a drain electrode disposed in contact respectively with the source region and the drain region of the oxide semiconductor layer; and a passivation layer disposed on the source electrode and the drain electrode. According to the aspect of the invention, since the step portion of the gate insulating film is covered with the covering region of the oxide semiconductor layer, the insulating layer becomes thick, so that a reduction in dielectric withstand voltage can be prevented. Moreover, since the covering region of the oxide semiconductor layer is separated from the transistor constituting region, a reduction in reliability due to the entrance of light is not caused.

(2) In the display device according to (1), the display device may further include: a gate wiring connected to the gate electrode; a source wiring connected to the source electrode; and a drain wiring connected to the drain electrode, wherein the gate insulating film may be disposed on the substrate so as to cover the gate wiring and have a second convex portion conforming to a surface shape of the gate wiring and a second step portion that changes in height along a shape rising from a periphery of the gate wiring, at least one of the source wiring and the drain wiring may three-dimensionally intersect with the gate wiring via the gate insulating film, and the oxide semiconductor layer may include a second covering region separated from the transistor constituting region so as to cover a region of the second step portion overlapping with the at least one of the source wiring and the drain wiring.

(3) In the display device according to (1) or (2), the oxide semiconductor layer may be formed such that the transistor constituting region and the covering region have the same thickness.

(4) In the display device according to (2), the oxide semiconductor layer may be formed such that the transistor constituting region, the covering region, and the second covering region have the same thickness.

(5) In the display device according to any one of (1) to (4), the oxide semiconductor layer may include one oxide semiconductor selected from a group consisting of In—Ga—Zn—O-based, In—Al—Zn—O-based, In—Sn—Zn—O-based, In—Zn—O-based, In—Sn—O-based, Zn—O-based, and Sn—O-based oxide semiconductors.

(6) A method for manufacturing a display device according to an aspect of the invention includes the steps of: forming a gate insulating film on a substrate so as to cover a gate electrode disposed on the substrate and have a convex portion conforming to a surface shape of the gate electrode and a step portion that changes in height along a shape rising from a periphery of the gate electrode; forming an oxide semiconductor layer on the gate insulating film so as to have a transistor constituting region having a channel region, a source region, and a drain region in a continuous and integral manner and a covering region being separated from the transistor constituting region and covering the step portion of the gate insulating film; forming a protective layer on the oxide semiconductor layer; patterning the protective layer, by etching that proceeds through the protective layer and the gate insulating film and in which the oxide semiconductor layer functions as an etching stopper, such that a portion of the protective layer is left as a channel protective layer on the channel region of the oxide semiconductor layer; forming a source electrode and a drain electrode so as to be in contact respectively with the source region and the drain region of the oxide semiconductor layer; and forming a passivation layer on the source electrode and the drain electrode. According to the aspect of the invention, since the covering region of the oxide semiconductor layer serves as an etching stopper, the step portion of the gate insulating film is not etched. Therefore, since the gate insulating film is not thinned at the step portion, a reduction in dielectric withstand voltage can be prevented. Moreover, since the covering region of the oxide semiconductor layer is separated from the transistor constituting region, a reduction in reliability due to the entrance of light is not caused.

(7) In the method for manufacturing the display device according to (6), a gate wiring may be formed on the substrate so as to be connected to the gate electrode, the gate insulating film may be formed so as to cover the gate wiring and have a second convex portion conforming to a surface shape of the gate wiring and a second step portion that changes in height along a shape rising from a periphery of the gate wiring, a source wiring may be formed on the gate insulating film so as to be connected to the source electrode, a drain wiring may be formed on the gate insulating film so as to be connected to the drain electrode, at least one of the source wiring and the drain wiring may be formed so as to three-dimensionally intersect with the gate wiring via the gate insulating film, and the oxide semiconductor layer may be formed so as to have a second covering region separated from the transistor constituting region so as to cover a region of the second step portion overlapping with the at least one of the source wiring and the drain wiring.

(8) In the method for manufacturing the display device according to (6) or (7), the oxide semiconductor layer may be formed such that the transistor constituting region and the covering region have the same thickness.

(9) In the method for manufacturing the display device according to (6), the oxide semiconductor layer may be formed such that the transistor constituting region, the covering region, and the second covering region have the same thickness.

(10) In the method for manufacturing the display device according to any one of (6) to (9), the oxide semiconductor layer may be formed from one oxide semiconductor selected from a group consisting of In—Ga—Zn—O-based, In—Al—Zn—O-based, In—Sn—Zn—O-based, In—Zn—O-based, In—Sn—O-based, Zn—O-based, and Sn—O-based oxide semiconductors.

DETAILED DESCRIPTION OF THE INVENTION

Hereinafter, an embodiment of the invention will be described with reference to the drawings.

Figure 1:
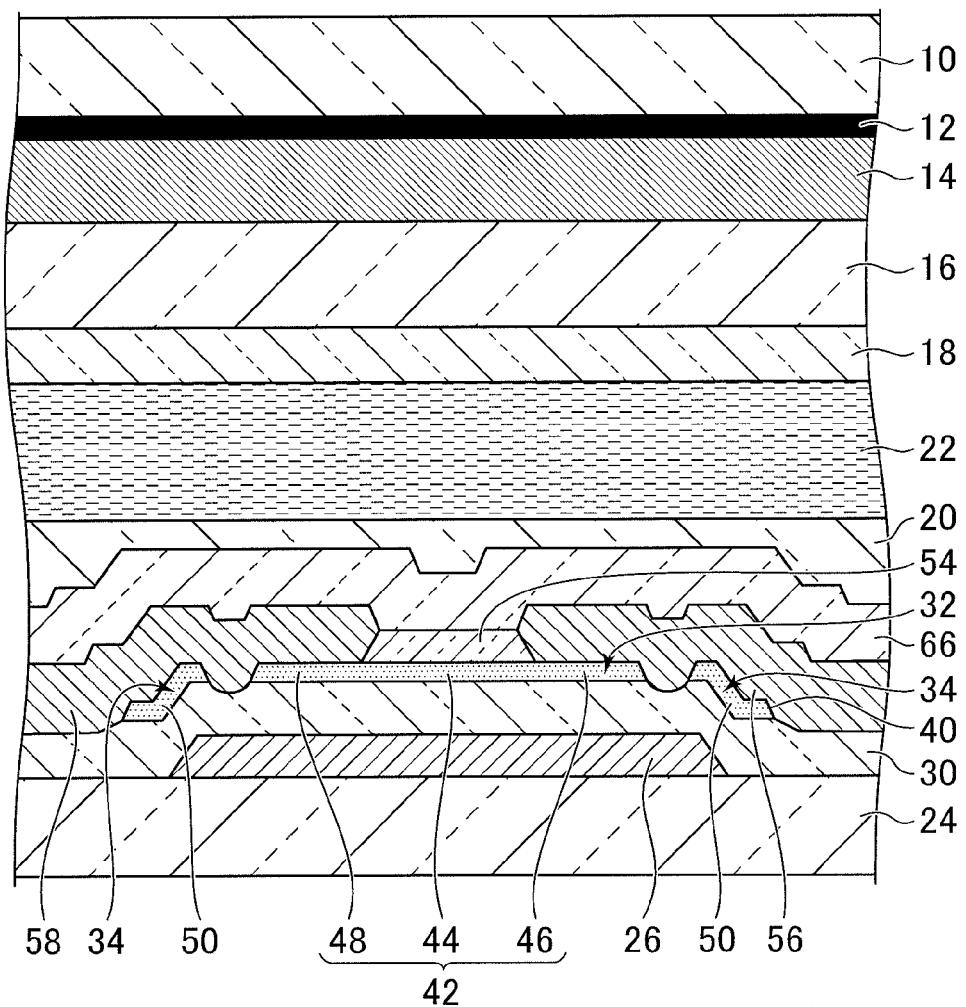
FIG. 1 is a cross-sectional view showing a display device according to an embodiment of the invention.

FIG. 1 is a cross-sectional view showing a display device according to the embodiment of the invention. The display device has a first substrate 10. On the first substrate 10, a black matrix 12, a color filter 14, a planarizing layer 16, and a first alignment film 18 are stacked to constitute a color filter substrate. A second alignment film 20 is arranged to face the first alignment film 18 with a cell gap. A liquid crystal material 22 is arranged between the first alignment film 18 and the second alignment film 20.

The display device shown in FIG. 1 is a liquid crystal display device in the embodiment. However, the display device may be other display devices such as an organic electroluminescence display device. The second alignment film 20 is the uppermost layer of a structure stacked on a second substrate 24. The second substrate 24 is composed of, for example, glass.

Figure 2:
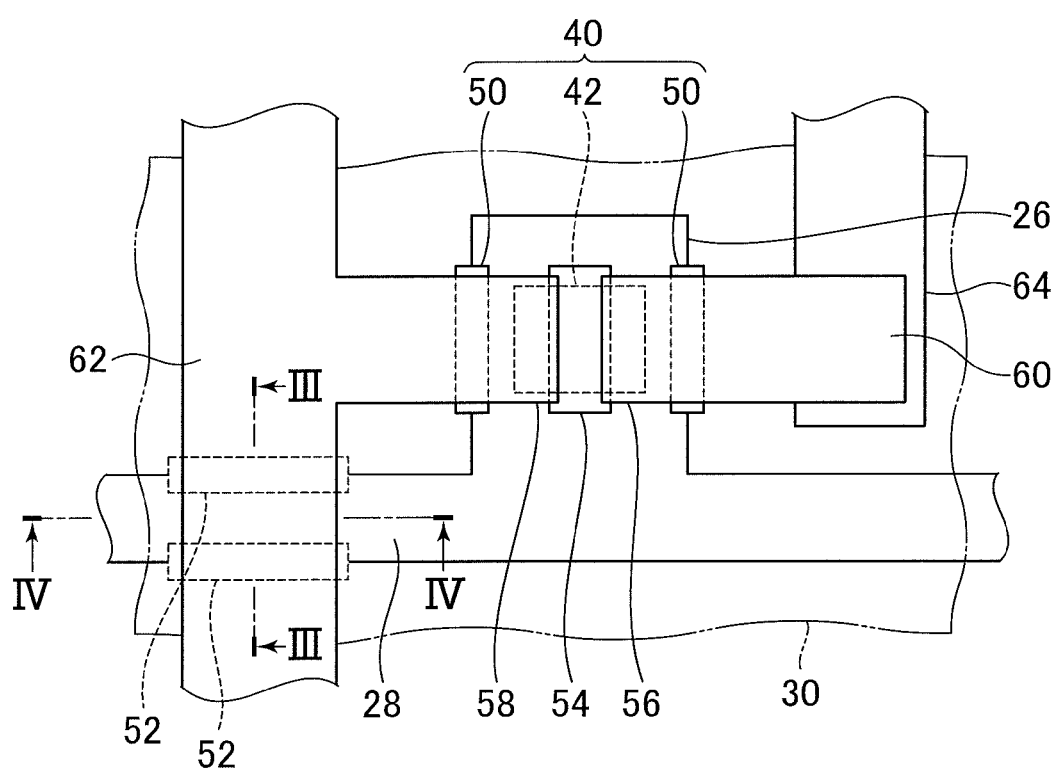
FIG. 2 is a plan view of a stacked structure of a second substrate.

FIG. 2 is a plan view of the stacked structure of the second substrate 24. On the second substrate 24, a gate electrode 26 of a transistor is formed. The transistor is a bottom-gate thin film transistor. The second substrate 24 on which the thin film transistor is formed is referred to as TFT (Thin Film Transistor) substrate. The gate electrode 26 is formed of an element selected from aluminum, molybdenum, chromium, copper, tungsten, titanium, zirconium, tantalum, silver, and manganese, an alloy of a combination of these elements, or the like. Moreover, a stacked structure, in which aluminum is stacked on titanium, or aluminum is interposed between an upper layer and a lower layer both composed of titanium, may be adopted. As shown in FIG. 2, the display device has a gate wiring 28 connected to the gate electrode 26.

The display device has a gate insulating film 30. The gate insulating film 30 can be formed of an insulating film such as a silicon oxide film, a silicon nitride film, or a silicon oxynitride film, and may have a structure in which these insulating films are stacked. However, the uppermost layer of the gate insulating film 30 or the gate insulating film 30 formed of one layer is preferably a silicon oxide film in consideration of an influence on an oxide semiconductor layer 40, which will be described later, because the oxide semiconductor layer 40 present on the gate insulating film 30 is in contact therewith. The gate insulating film 30 may be configured with an optimum film thickness, within a film thickness range of from 80 nm to 2000 nm, in consideration of dielectric withstand voltage or capacitance.

The gate insulating film 30 is disposed on the second substrate 24 so as to cover the gate electrode 26. The gate insulating film 30 has a convex portion 32 conforming to the surface shape of the gate electrode 26. Specifically, the surface of the gate electrode 26 is raised from the surface of the second substrate 24, so that the convex portion 32 is formed. The gate insulating film 30 has step portions 34 that change in height along a shape rising from the periphery of the gate electrode 26. That is, the step portion 34 is formed above the edge of the gate electrode 26.

Figure 3:
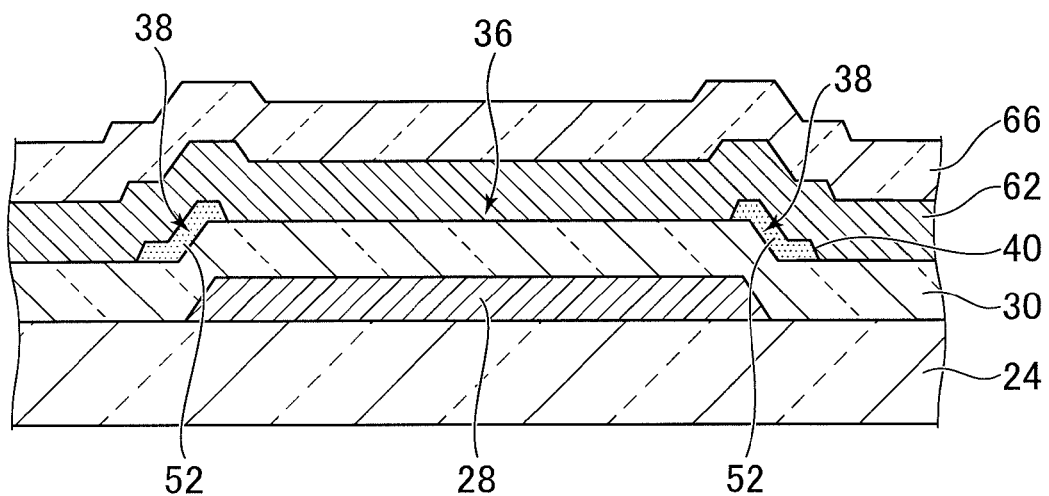
FIG. 3 is a cross-sectional view of the structure shown in FIG. 2 taken along line III-III.
Figure 4:
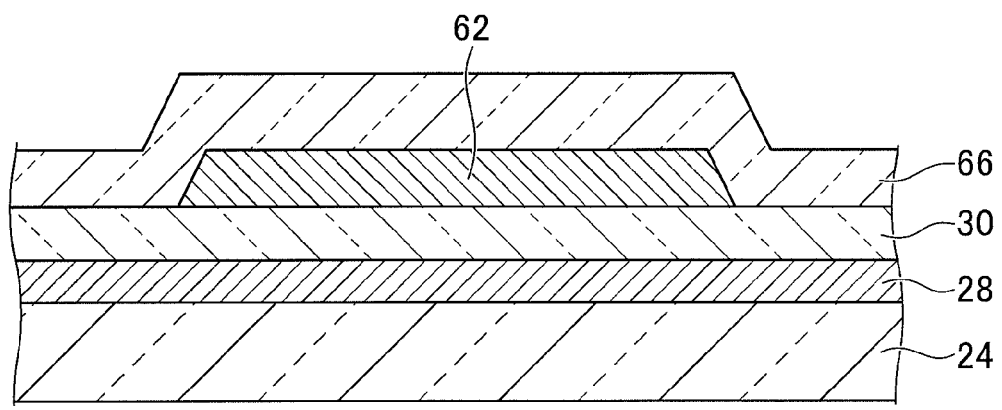
FIG. 4 is a cross-sectional view of the structure shown in FIG. 2 taken along line IV-IV.

FIG. 3 is a cross-sectional view of the structure shown in FIG. 2 taken along line FIG. 4 is a cross-sectional view of the structure shown in FIG. 2 taken along line IV-IV.

The gate insulating film 30 is disposed on the second substrate 24 so as to cover also the gate wiring 28. As shown in FIG. 3, the gate insulating film 30 has a second convex portion 36 conforming to the surface shape of the gate wiring 28. Specifically, the surface of the gate wiring 28 is raised from the surface of the second substrate 24, so that the second convex portion 36 is formed. The gate insulating film 30 has second step portions 38 that change in height along a shape rising from the periphery of the gate wiring 28. That is, the second step portion 38 is formed above the side edge of the gate wiring 28.

The display device has the oxide semiconductor layer 40.

The oxide semiconductor layer 40 is, for example, an In—Ga—Zn—O-based oxide semiconductor composed of, as main components, elements of indium, gallium, zinc, and oxygen, which is also referred to as IGZO film. In addition, oxide semiconductors such as In—Al—Zn—O-based, In—Sn—Zn—O-based, In—Zn—O-based, In—Sn—O-based, Zn—O-based, and Sn—O-based oxide semiconductors may be used. The film thickness of the oxide semiconductor layer 40 may be adjusted within a range of from 30 nm to 500 nm in accordance with purposes such as forming a thick film when used for a device requiring a high current.

The oxide semiconductor layer 40 is disposed on the gate insulating film 30. As shown in FIGS. 1 and 2, the oxide semiconductor layer 40 has a transistor constituting region 42. The transistor constituting region 42 has a channel region 44, a source region 46, and a drain region 48 in a continuous and integral manner.

As shown in FIG. 1, the oxide semiconductor layer 40 includes covering regions 50 that cover the step portions 34 of the gate insulating film 30. The covering regions 50 are separated from the transistor constituting region 42. The covering region 50 is formed so as to have the same thickness as that of the transistor constituting region 42.

According to the embodiment, the step portion 34 of the gate insulating film 30 is covered with the covering region 50 of the oxide semiconductor layer 40. Therefore, the insulating layer becomes thick, so that a reduction in dielectric withstand voltage can be prevented. Moreover, since the covering regions 50 of the oxide semiconductor layer 40 are separated from the transistor constituting region 42, a reduction in reliability due to the entrance of light is not caused.

As shown in FIG. 2, the oxide semiconductor layer 40 includes second covering regions 52. The second covering regions 52 are arranged on the second step portions 38. The second covering regions 52 are separated from the transistor constituting region 42. The second covering region 52 is formed so as to have the same thickness as that of the transistor constituting region 42 and the covering region 50.

According to the embodiment, the second step portion 38 of the gate insulating film 30 is covered with the second covering region 52 of the oxide semiconductor layer 40. Therefore, the insulating layer becomes thick, so that a reduction in dielectric withstand voltage can be prevented. Moreover, since the second covering regions 52 of the oxide semiconductor layer 40 are separated from the transistor constituting region 42, a reduction in reliability due to the entrance of light is not caused.

As shown in FIGS. 1 and 2, the display device has a channel protective layer 54. The channel protective layer 54 is formed of a silicon oxide film. The channel protective layer 54 is disposed on the channel region 44 of the oxide semiconductor layer 40.

The display device has a source electrode 56 and a drain electrode 58. The source electrode 56 and the drain electrode 58 are disposed in contact respectively with the source region 46 and the drain region 48 of the oxide semiconductor layer 40. The source electrode 56 and the drain electrode 58 are formed from the above-described materials that can be selected as the gate electrode 26, and may be formed from the same material as that of the gate electrode 26.

As shown in FIG. 2, a source wiring 60 is connected to the source electrode 56, while a drain wiring 62 is connected to the drain electrode 58. At least one (for example, the drain wiring 62) of the source wiring 60 and the drain wiring 62 three-dimensionally intersects with the gate wiring 28 via the gate insulating film 30. The second covering region 52 covers a region of the second step portion 38 overlapping with at least one of the source wiring 60 and the drain wiring 62. The other (for example, the source wiring 60) of the source wiring 60 and the drain wiring 62 is connected to a pixel electrode 64 in the example of FIG. 2.

The display device has a passivation layer 66. The passivation layer 66 may be formed of an insulating film such as a silicon oxide film, a silicon nitride film, or a silicon oxynitride film, or may be formed by stacking these insulating films. The passivation layer 66 is disposed on the source electrode 56 and the drain electrode 58. The second alignment film 20 is formed on the passivation layer 66.

FIGS. 5A to 6C explain a method for manufacturing the display device according to the embodiment of the invention.

The method for manufacturing the display device includes forming the gate insulating film 30, forming the oxide semiconductor layer 40, forming the channel protective layer 54, forming the source electrode 56 and the drain electrode 58, and forming the passivation layer 66.

Figure 5A:
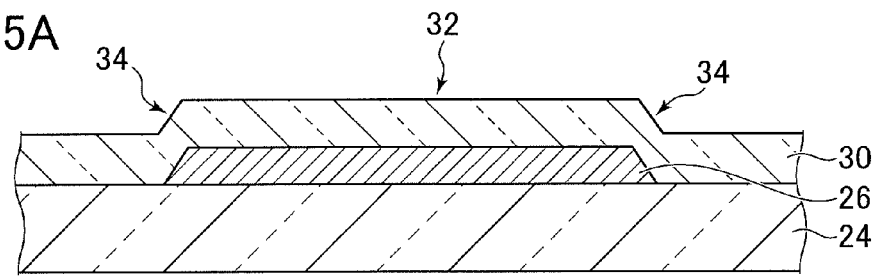
FIGS. 5A to 5D explain a method for manufacturing the display device according to the embodiment of the invention.

First, the second substrate 24 on which the gate electrode 26 is disposed is prepared (refer to FIG. 5A). In the forming process of the gate electrode 26, a metal conductive film such as a molybdenum film or an aluminum film is deposited by, for example, a sputtering method. Then, after applying a photosensitive resin film on the metal conductive film, the photosensitive resin film is patterned by exposure and development to form a resist pattern. Thereafter, the metal conductive film exposed from the resist pattern is removed by wet etching or dry etching, and then the resist pattern is peeled off, so that the gate electrode 26 is formed. When the second substrate 24 is composed of glass, a silicon nitride film may be formed on the second substrate 24 and the gate electrode 26 may be formed on the silicon nitride film for preventing mixing of alkali ion or the like from glass.

As shown in FIG. 5A, the gate insulating film 30 is formed on the second substrate 24 so as to cover the gate electrode 26. The gate insulating film 30 is formed by depositing a silicon oxide film, a silicon nitride film, a silicon oxynitride film, or the like by a plasma CVD (Chemical Vapor Deposition) method. In the gate insulating film 30, the convex portion 32 is formed conforming to the surface shape of the gate electrode 26. In the gate insulating film 30, the step portions 34 that change in height along the shape rising from the periphery of the gate electrode 26 are formed.

On the second substrate 24, the gate wiring 28 is formed so as to be connected to the gate electrode 26 (refer to FIG. 2). The gate insulating film 30 is formed so as to cover the gate wiring 28. The gate insulating film 30 is formed so as to have the second convex portion 36 (refer to FIG. 3) conforming to the surface shape of the gate wiring 28. The gate insulating film 30 is formed so as to have the second step portions 38 (refer to FIG. 3) that change in height along the shape rising from the periphery of the gate wiring 28.

Figure 5B:
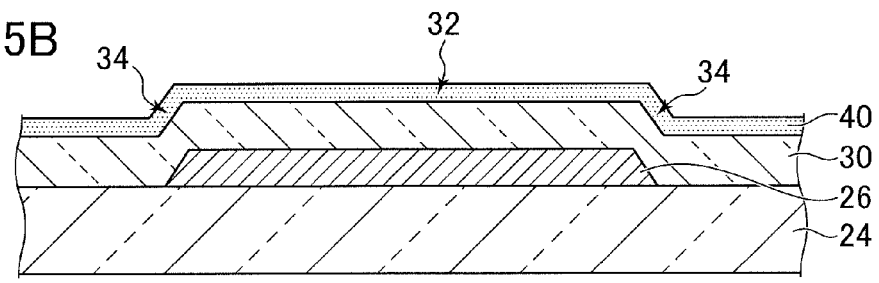

As shown in FIG. 5B, the oxide semiconductor layer 40 is formed on the gate insulating film 30. In the forming process of the oxide semiconductor layer 40, an oxide semiconductor such as an In—Ga—Zn—O-based, In—Al—Zn—O-based, In—Sn—Zn—O-based, In—Zn—O-based, In—Sn—O- based, Zn—O-based, or Sn—O-based oxide semiconductor is deposited by a sputtering method.

Figure 5C:
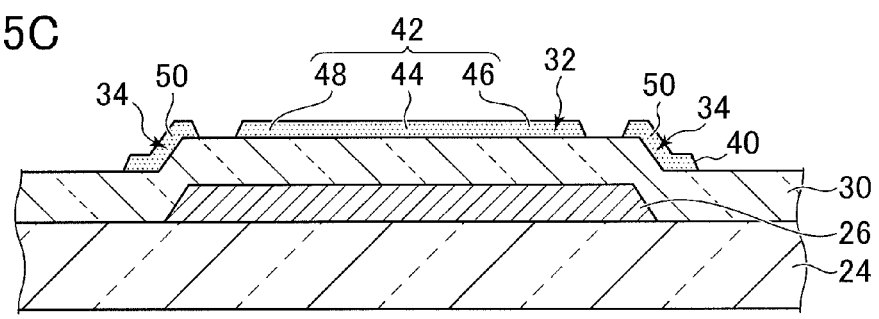

As shown in FIG. 5C, the oxide semiconductor layer 40 is patterned so as to have the transistor constituting region 42. Specifically, after applying a photosensitive resin film on the oxide semiconductor layer 40, the photosensitive resin film is patterned by exposure and development to form a resist pattern. The resist pattern is formed so as to cover the transistor constituting region 42, the covering regions 50, and the second covering regions 52 (refer to FIG. 2) of the oxide semiconductor layer 40. Thereafter, the oxide semiconductor layer 40 exposed from the resist pattern is removed by wet etching, and then the resist pattern is peeled off. By subjecting the oxide semiconductor layer 40 to plasma treatment using oxygen or nitrous oxide, the oxide semiconductor layer 40 with less oxygen defects can be formed.

The transistor constituting region 42 has the channel region 44, the source region 46, and the drain region 48 in a continuous and integral manner. The oxide semiconductor is formed so as to have the covering regions 50. The covering regions 50 are separated from the transistor constituting region 42 and cover the step portions 34 of the gate insulating film 30. The covering region 50 is formed so as to have the same thickness as that of the transistor constituting region 42.

The oxide semiconductor layer 40 is formed so as to have the second covering regions 52 that cover the second step portions 38 of the gate insulating film 30 (refer to FIG. 3). The second covering regions 52 are formed so as to be separated from the transistor constituting region 42. The second covering region 52 is formed so as to have the same thickness as that of the transistor constituting region 42 and the covering region 50.

Figure 5D:
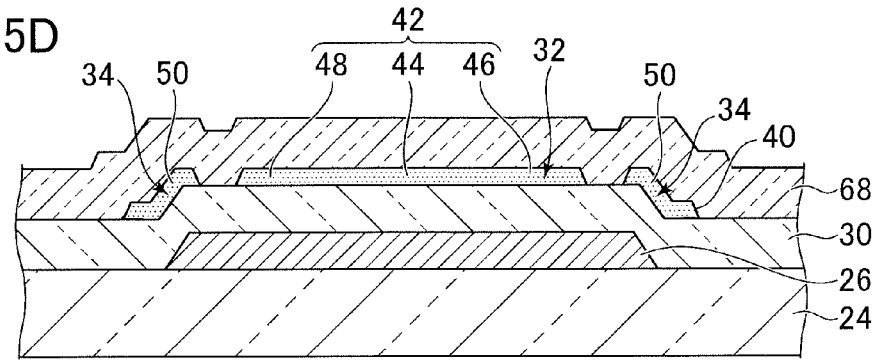

As shown in FIG. 5D, a protective layer 68 is formed on the oxide semiconductor layer 40. The protective layer 68 is formed by depositing a silicon oxide film by a plasma CVD method or the like.

Figure 6A:
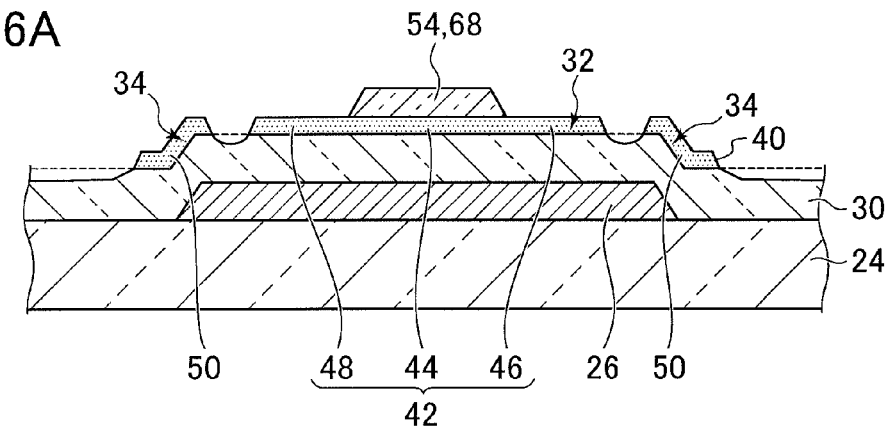
FIGS. 6A to 6C explain the method for manufacturing the display device according to the embodiment of the invention.

As shown in FIG. 6A, the protective layer 68 is patterned. Specifically, the protective layer 68 is patterned such that a portion of the protective layer 68 is left as the channel protective layer 54 on the channel region 44 of the oxide semiconductor layer 40. The patterning is performed by etching. For example, a photosensitive resin film is applied on the protective layer 68, and the photosensitive resin film is patterned by exposure and development to form a resist pattern. Thereafter, the protective layer 68 exposed from the resist pattern is removed by dry etching to form the channel protective layer 54.

In the etching, etching proceeds through the protective layer 68 and the gate insulating film 30, and the oxide semiconductor layer 40 functions as an etching stopper. That is, when the protective layer 68 is dry etched, the gate insulating film 30 is not etched at the portions covered with the oxide semiconductor layer 40 because the oxide semiconductor layer 40 acts as an etching stopper. For example, when an etching gas such as $CF_4$ is used as an etchant, a silicon oxide film is reduced in thickness by ion bombardment caused by plasma, but an oxide semiconductor such as IGZO is highly resistant to ion bombardment and hardly reduced in thickness. Therefore, the oxide semiconductor layer 40 acts as an etching stopper.

Since an element mainly constituting the protective layer 68 and the gate insulating film 30 is $SiO_x$ and the etching rates of the protective layer 68 and the gate insulating film 30 are substantially the same, the gate insulating film 30 exposed from the oxide semiconductor layer 40 is reduced in thickness during the dry etching process of the protective layer 68. It is hard to equalize the etching rate throughout the entire surface of a large-sized substrate, so that the amount of reduction in thickness varies depending on the positions. After forming the source electrode 56 and the drain electrode 58, the coverage of the gate insulating film 30 is poor on the edge of the gate electrode 26. Therefore, when the amount of reduction in thickness of the gate insulating film 30 is increased in addition to the poor coverage, a reduction in withstand voltage, such as the case where a dielectric withstand voltage between the gate electrode 26 and the drain electrode 58 falls below 100V, is sometimes caused.

In the embodiment, at the position where the coverage of the gate insulating film 30 is poor on the edge of the gate electrode 26, the oxide semiconductor layer 40 (the covering region 50) is formed. Therefore, the oxide semiconductor layer 40 serves as an etching stopper during the dry etching process of the protective layer 68, which can prevent a reduction in thickness of the gate insulating film 30. Due to this, the dielectric withstand voltage between the gate electrode 26 and the drain electrode 58 at the position where the coverage of the gate insulating film 30 is poor on the edge of the gate electrode 26 does not fall below 200V, so that a thin film transistor with high reliability can be realized.

In an amorphous silicon TFT (Thin Film Transistor) or a polysilicon TFT (Thin Film Transistor), even when it is intended to use a semiconductor layer for an etching stopper in the same manner as in the above, amorphous silicon or polysilicon has substantially the same etching rate as that of a silicon oxide film or a silicon nitride film and therefore it is difficult to use the semiconductor layer as an etching stopper. In contrast to this, when an oxide semiconductor is used for a transistor like the embodiment, it is possible to form an oxide semiconductor at a step portion and use the oxide semiconductor as an etching stopper in dry etching.

For example, in the case where a channel layer of 50 nm thickness and an etching stopper layer of 200 nm thickness are formed, even when amorphous silicon or polysilicon of 50 nm thickness, which is the same thickness as the channel layer, is formed at the step portion, all of the amorphous silicon or polysilicon of 50 nm thickness formed at the step portion is removed during dry etching of the etching stopper of 200 nm thickness. Therefore, the etching reaches the gate insulating film, so that the gate insulating film is also reduced in thickness. On the other hand, since an oxide semiconductor has resistance to dry etching as described above, such a problem does not occur. Accordingly, the embodiment is a characteristic technique obtained when an oxide semiconductor is used as a channel layer.

After the protective layer 68 is dry etched, the resist pattern is peeled off. Although not shown in the drawing, a contact hole to the gate electrode 26 may be formed through the gate insulating film 30 before forming the source electrode 56 and the drain electrode 58.

Figure 6B:
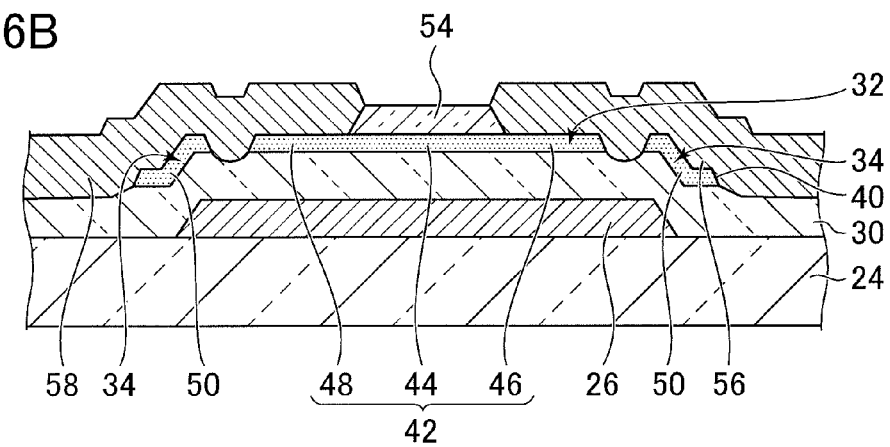

As shown in FIG. 6B, the source electrode 56 and the drain electrode 58 are formed. In the forming process of the source electrode 56 and the drain electrode 58, a metal conductive film such as a molybdenum film or an aluminum film is deposited by a sputtering method. Subsequently, a photosensitive resin film is applied on the metal conductive film, and the photosensitive resin film is patterned by exposure and development to form a resist pattern. Thereafter, the metal conductive film exposed from the resist pattern is removed by wet etching, and then the resist pattern is peeled off, so that the source electrode 56 and the drain electrode 58 are formed. The source electrode 56 and the drain electrode 58 are formed so as to be in contact respectively with the source region 46 and the drain region 48 of the oxide semiconductor layer 40.

The source wiring 60 is formed on the gate insulating film 30 so as to be connected to the source electrode 56 (refer to FIG. 2). The drain wiring 62 is formed on the gate insulating film 30 so as to be connected to the drain electrode 58. At least one of the source wiring 60 and the drain wiring 62 is formed so as to three-dimensionally intersect with the gate wiring 28 via the gate insulating film 30. The second covering regions 52 of the oxide semiconductor layer 40 are formed at the second step portions 38 of the gate insulating film 30. At least one of the source wiring 60 and the drain wiring 62, which three-dimensionally intersects with the gate wiring 28, is formed so as to cross over the second covering regions 52.

Figure 6C:
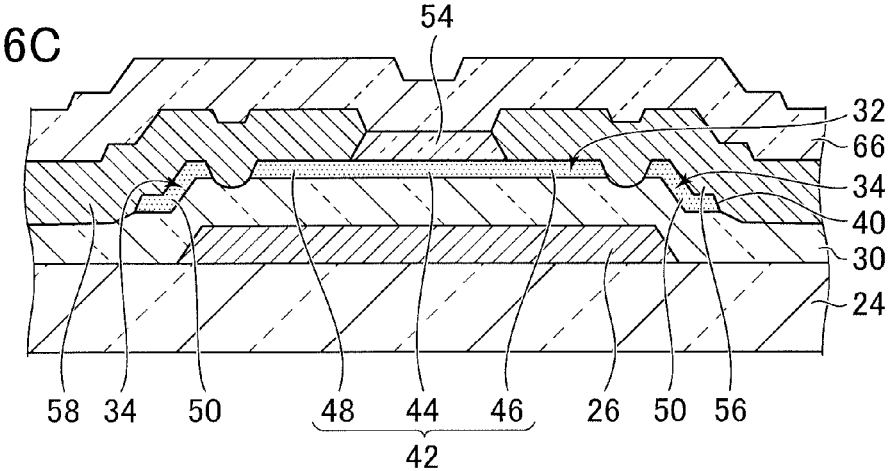

As shown in FIG. 6C, the passivation layer 66 is formed on the source electrode 56 and the drain electrode 58. The passivation layer 66 is formed by depositing an insulating film such as a silicon oxide film, a silicon nitride film, or a silicon oxynitride film by a plasma CVD method or the like. Thereafter, although not shown in the drawing, a contact hole to each of the source electrode 56 and the drain electrode 58 is formed through the passivation layer 66. On the passivation layer 66, as shown in FIG. 1, the second alignment film 20 is formed. Thereafter, the first substrate 10 and the second substrate 24 are arranged to face each other, and the liquid crystal material 22 is arranged therebetween. In addition, the manufacturing method according to the embodiment includes a well-known process used when a liquid crystal display device is manufactured.

According to the embodiment, since the covering region 50 of the oxide semiconductor layer 40 serves as an etching stopper, the step portion 34 of the gate insulating film 30 is not etched. Therefore, since the gate insulating film 30 is not thinned at the step portion 34, a reduction in dielectric withstand voltage can be prevented. Moreover, since the covering region 50 of the oxide semiconductor layer 40 is separated from the transistor constituting region 42, a reduction in reliability due to the entrance of light is not caused.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a substrate;
    a gate electrode disposed on the substrate;
    a gate insulating film disposed on the substrate so as to cover the gate electrode and having a convex portion conforming to a surface shape of the gate electrode and a step portion that changes in height along a shape rising from a periphery of the gate electrode;
    an oxide semiconductor layer disposed on the gate insulating film so as to have a transistor constituting region having a channel region, a source region, and a drain region in a continuous and integral manner and a covering region being separated from the transistor constituting region and covering the step portion of the gate insulating film;
    a channel protective layer disposed on the channel region of the oxide semiconductor layer;
    a source electrode and a drain electrode disposed in contact respectively with the source region and the drain region of the oxide semiconductor layer; and
    a passivation layer disposed on the source electrode and the drain electrode.

2. The display device according to claim 1, further comprising:
    a gate wiring connected to the gate electrode;
    a source wiring connected to the source electrode; and
    a drain wiring connected to the drain electrode, wherein
    the gate insulating film is disposed on the substrate so as to cover the gate wiring and has a second convex portion conforming to a surface shape of the gate wiring and a second step portion that changes in height along a shape rising from a periphery of the gate wiring,
    at least one of the source wiring and the drain wiring three-dimensionally intersects with the gate wiring via the gate insulating film, and
    the oxide semiconductor layer includes a second covering region separated from the transistor constituting region so as to cover a region of the second step portion overlapping with the at least one of the source wiring and the drain wiring.

3. The display device according to claim 1, wherein
    the oxide semiconductor layer is formed such that the transistor constituting region and the covering region have the same thickness.

4. The display device according to claim 2, wherein
    the oxide semiconductor layer is formed such that the transistor constituting region, the covering region, and the second covering region have the same thickness.

5. The display device according to claim 1, wherein
    the oxide semiconductor layer includes one oxide semiconductor selected from a group consisting of In—Ga—Zn—O-based, In—Al—Zn—O-based, In—Sn—Zn—O-based, In—Zn—O-based, In—Sn—O-based, Zn—O-based, and Sn—O-based oxide semiconductors.

6. A method for manufacturing a display device, comprising the steps of:
    forming a gate insulating film on a substrate so as to cover a gate electrode disposed on the substrate and have a convex portion conforming to a surface shape of the gate electrode and a step portion that changes in height along a shape rising from a periphery of the gate electrode;
    forming an oxide semiconductor layer on the gate insulating film so as to have a transistor constituting region having a channel region, a source region, and a drain region in a continuous and integral manner and a covering region being separated from the transistor constituting region and covering the step portion of the gate insulating film;
    forming a protective layer on the oxide semiconductor layer;
    patterning the protective layer, by etching that proceeds through the protective layer and the gate insulating film and in which the oxide semiconductor layer functions as an etching stopper, such that a portion of the protective layer is left as a channel protective layer on the channel region of the oxide semiconductor layer;
    forming a source electrode and a drain electrode so as to be in contact respectively with the source region and the drain region of the oxide semiconductor layer; and
    forming a passivation layer on the source electrode and the drain electrode.

7. The method for manufacturing the display device according to claim 6, wherein
    a gate wiring is formed on the substrate so as to be connected to the gate electrode,
    the gate insulating film is formed so as to cover the gate wiring and have a second convex portion conforming to a surface shape of the gate wiring and a second step portion that changes in height along a shape rising from a periphery of the gate wiring, a source wiring is formed on the gate insulating film so as to be connected to the source electrode, a drain wiring is formed on the gate insulating film so as to be connected to the drain electrode, at least one of the source wiring and the drain wiring is formed so as to three-dimensionally intersect with the gate wiring via the gate insulating film, and the oxide semiconductor layer is formed so as to have a second covering region separated from the transistor constituting region so as to cover a region of the second step portion overlapping with the at least one of the source wiring and the drain wiring.

8. The method for manufacturing the display device according to claim 6, wherein the oxide semiconductor layer is formed such that the transistor constituting region and the covering region have the same thickness.

9. The method for manufacturing the display device according to claim 7, wherein the oxide semiconductor layer is formed such that the transistor constituting region, the covering region, and the second covering region have the same thickness.

10. The method for manufacturing the display device according to claim 6, wherein the oxide semiconductor layer is formed from one oxide semiconductor selected from a group consisting of In—Ga—Zn—O-based, In—Al—Zn—O-based, In—Sn—Zn—O-based, In—Zn—O-based, In—Sn—O-based, Zn—O-based, and Sn—O-based oxide semiconductors.

* * * * *